US008975663B2

(12) United States Patent
Okamoto

(10) Patent No.: US 8,975,663 B2
(45) Date of Patent: Mar. 10, 2015

(54) SEMICONDUCTOR DEVICE

(71) Applicant: Fuji Electric Co., Ltd., Kawasaki-shi (JP)

(72) Inventor: Yujin Okamoto, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 47 days.

(21) Appl. No.: 13/964,691

(22) Filed: Aug. 12, 2013

(65) Prior Publication Data
US 2014/0070269 A1 Mar. 13, 2014

(30) Foreign Application Priority Data

Sep. 13, 2012 (JP) .................................. 2012-202079

(51) Int. Cl.
*H01L 23/34* (2006.01)
*H01L 27/07* (2006.01)
*H01L 27/02* (2006.01)
*H01L 23/64* (2006.01)
*H01L 25/07* (2006.01)
*H01L 25/18* (2006.01)
*H01L 23/467* (2006.01)

(52) U.S. Cl.
CPC .......... *H01L 27/0248* (2013.01); *H01L 23/647* (2013.01); *H01L 25/072* (2013.01); *H01L 25/18* (2013.01); *H01L 23/467* (2013.01); *H01L 2924/0002* (2013.01)
USPC ........... 257/140; 257/364; 257/536; 257/539; 257/577; 257/713; 257/E27.037; 257/E23.08; 257/E27.03

(58) Field of Classification Search
USPC ................. 257/140, 364, 536, 539, 577, 713, 257/E27.03, E27.037, E23.08
See application file for complete search history.

(56) References Cited

U.S. PATENT DOCUMENTS

2004/0104775 A1* 6/2004 Seremeta ...................... 330/310
2006/0039114 A1* 2/2006 Hamann et al. ............... 361/704
2008/0066022 A1* 3/2008 Chandra .......................... 716/4

FOREIGN PATENT DOCUMENTS

JP 2003-188336 A 7/2003
JP 2006-041407 A 2/2006
JP 2006-191774 A 7/2006

* cited by examiner

*Primary Examiner* — Victor A Mandala
(74) *Attorney, Agent, or Firm* — Rabin & Berdo, P.C.

(57) ABSTRACT

There is provided a semiconductor device such that it is possible to average the temperatures of a plurality of semiconductor chips simply by providing gate resistors. The semiconductor device includes a semiconductor module wherein a plurality of circuit substrates on which are mounted one or more semiconductor chips having a gate terminal and a gate resistor connected to the gate terminal are disposed in parallel, wherein the disposition distance of the gate resistor from the semiconductor chip is set based on the temperature of the semiconductor chip.

16 Claims, 13 Drawing Sheets

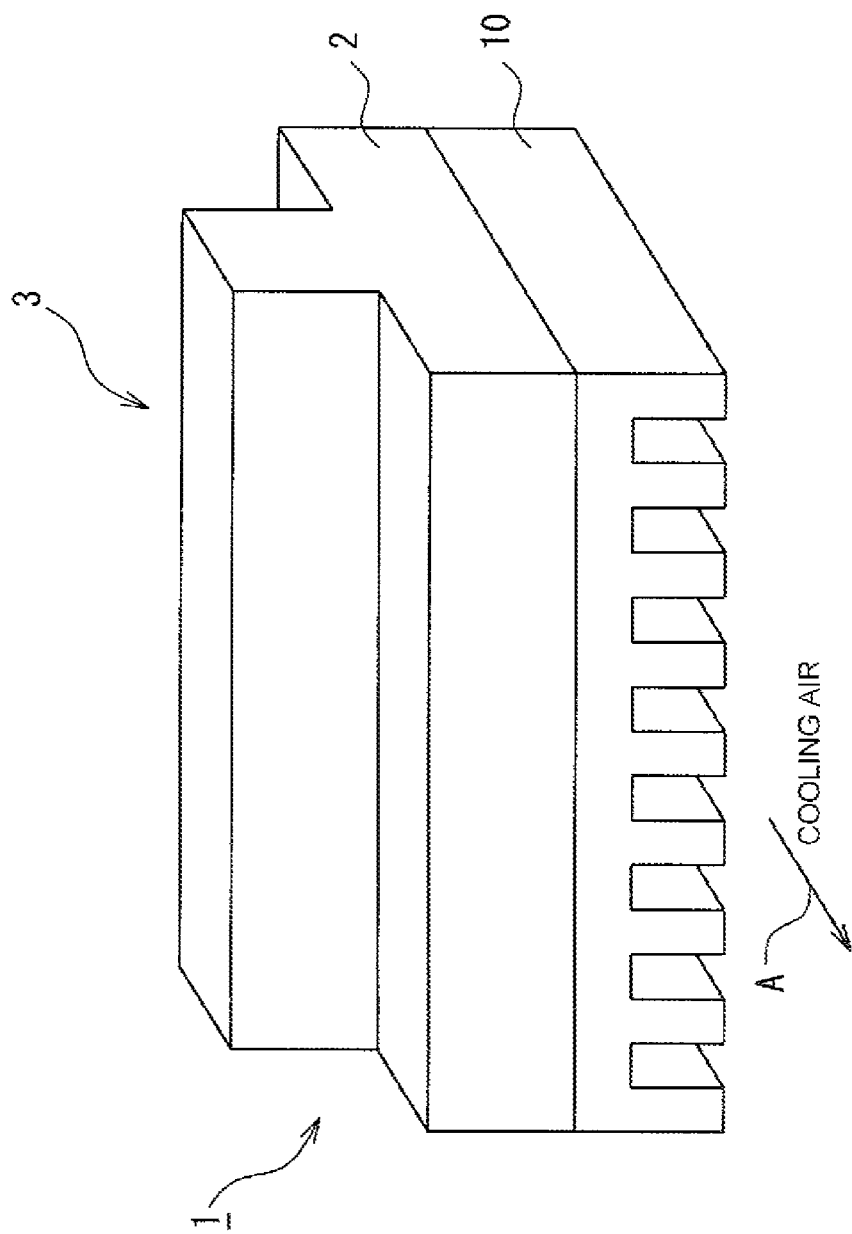

$V_{CE} \times I_C$

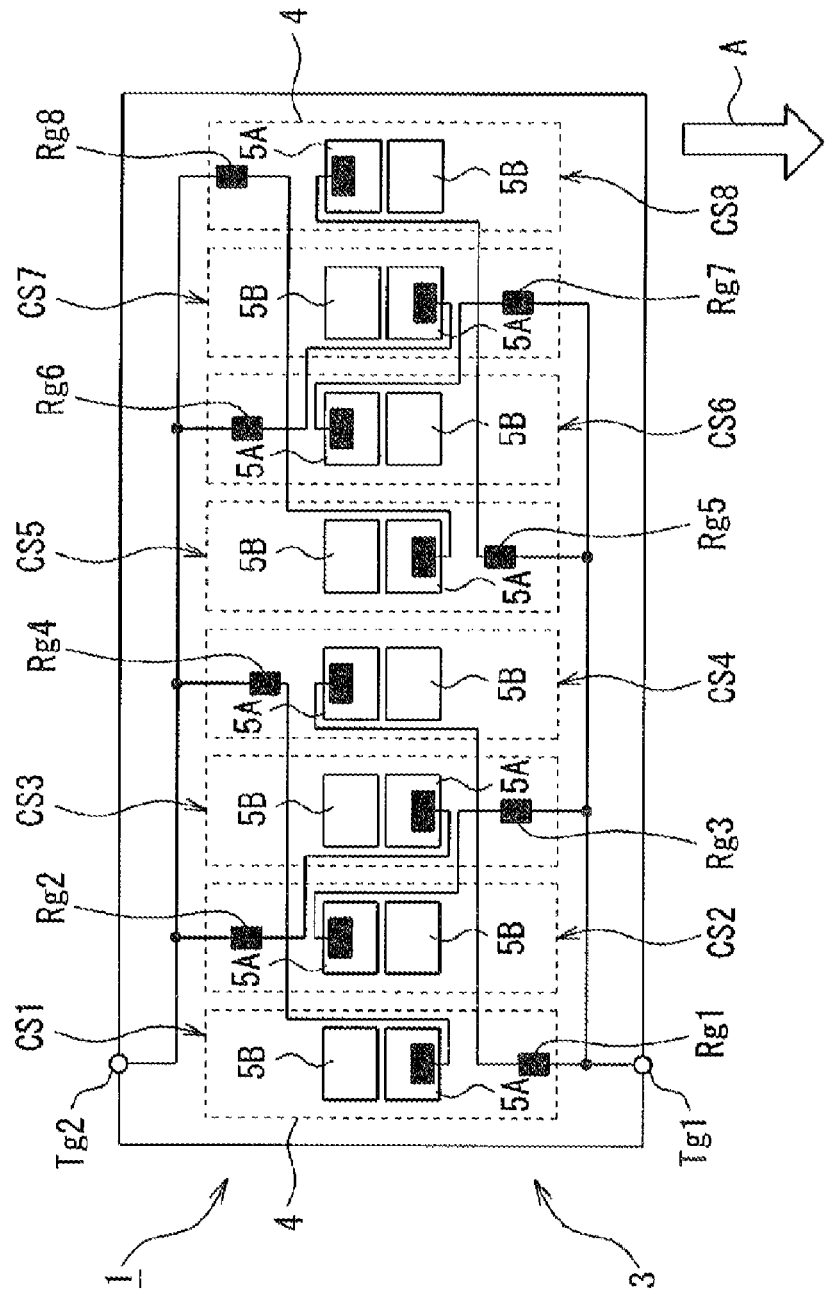

SEMICONDUCTOR DEVICE

BACKGROUND OF THE INVENTION

1. Field of the Invention

The present invention relates to a semiconductor device, such as a power device or high frequency application switching IC, wherein semiconductor circuits having a semiconductor chip and gate resistor are disposed in parallel.

2. Description of the Background Art

Power converting inverter devices are widely used as one kind of power conversion device. For example, an electric motor is normally used as the drive source in an electric vehicle, hybrid vehicle, or the like, and inverter devices are widely utilized in controlling this kind of motor.

A semiconductor device configured of a semiconductor module wherein a plurality of circuit substrates on which is mounted a power device such as an insulated gate bipolar transistor (IGBT) or free wheeling diode (FWD) are disposed, and sealed into a predetermined form using a mold resin material, is used as this kind of power conversion device.

This semiconductor device is such that, as heat is generated from a semiconductor chip, semiconductor chip temperature management is necessary.

Heretofore, a power conversion device wherein temperature detection for protecting a power semiconductor element against heat is carried out in the vicinity of a part in which the power semiconductor element is packaged, and using a temperature detection element disposed in the vicinity of either one of an emitter terminal or a collector terminal of the power semiconductor element has been proposed as this kind of semiconductor device (for example, refer to JP-A-2006-41407).

Also, there has been proposed a power control circuit wherein, when a plurality of IGBT elements are disposed, the gate resistance value of an IGBT element with good cooling efficiency is set high while the gate resistance value of an IGBT element with poor cooling efficiency is set low (for example, refer to JP-A-2006-191774).

Furthermore, there has been proposed a thermistor-incorporating power semiconductor module configured with an inverter, or the like, wherein a plurality of power semiconductor chips of IGBTs or FETs are fixed to copper circuits, wherein a thermistor is disposed in a position near the power semiconductor chip on the copper circuit, and the thermistor is electrically connected to the gate of the power semiconductor chip, increasing the gate resistance value when the temperature of the power semiconductor chip is high, and reducing the gate resistance value when the temperature of the power semiconductor chip is low (for example, refer to JP-A-2003-188336).

However, the heretofore known example described in JP-A-2006-41407 is such that a temperature detection element is disposed in the vicinity of a power semiconductor element, and as all the gates of a plurality of power semiconductor elements are turned off when the temperature detected by the temperature detection element is equal to or higher than a decision temperature, there is an unsolved problem in that it is not possible to individually control the gates of the plurality of power semiconductor elements in accordance with the exothermic temperature.

Also, the heretofore known example described in JP-A-2006-191774 is such that, as the gate resistance value of an IGBT element with good cooling efficiency is set high in comparison with the gate resistance value of an IGBT element with poor cooling efficiency when a plurality of IGBT elements are present, it is possible to control individually in accordance with the IGBT element temperature, but it is necessary to set a different resistance value for each IGBT element, and the gate resistor has temperature characteristics such that the resistance value increases in response to an increase in temperature, because of which there is an unsolved problem in that it is difficult to obtain a set resistance value.

Furthermore, the heretofore known example described in JP-A-2003-188336 is such that it is necessary to use a thermistor having negative resistance characteristics wherein the resistance value decreases further the higher the temperature becomes, and it is difficult to obtain the resistance characteristics necessary for the gate resistor with the thermistor alone, because of which it is necessary to obtain the resistance characteristics necessary for the gate resistor with a combined resistance by disposing a series circuit of the thermistor and a resistor and a resistor in parallel with the series circuit, and there is an unsolved problem in that the resistor configuration becomes complex.

SUMMARY OF THE INVENTION

Therefore, the invention, having been contrived focusing on the unsolved problem of the heretofore known examples, has an object of providing a semiconductor device such that it is possible to average the temperatures of a plurality of semiconductor chips simply by providing a gate resistor.

In order to achieve the object, a first aspect of a semiconductor device according to the invention includes a semiconductor module wherein a plurality of circuit substrates on which are mounted at least one or more semiconductor chips having a gate terminal and a gate resistor connected to the gate terminal are disposed in parallel. Further, the disposition distance of the gate resistor from the semiconductor chip is set based on the temperature of the semiconductor chip.

Also, a second aspect of the semiconductor device according to the invention is such that the disposition distance between the gate resistor and the semiconductor chip is set to be long when the temperature of the semiconductor chip is high and set to be short when the temperature of the semiconductor chip is low.

Also, a third aspect of the semiconductor device according to the invention is such that the disposition distance between the gate resistor and the semiconductor chip in a central portion circuit substrate is set to be long with respect to a disposition distance in the circuit substrates in either end portion when a refrigerant flow is supplied in a direction intersecting with the disposition direction of the circuit substrates.

Also, a fourth aspect of the semiconductor device according to the invention is such that the disposition distance between the gate resistor and the semiconductor chip in a downstream side circuit substrate is set to be long with respect to the disposition distance between the gate resistor and the semiconductor chip in an upstream side circuit substrate when a refrigerant flow is supplied in the disposition direction of the circuit substrates.

Also, a fifth aspect of the semiconductor device according to the invention is such that the circuit substrates are such that parallel wiring patterns having a plurality of connection pads to which a discrete resistor is connected so as to enable a selection of the disposition distance are formed in a region in the vicinity of the semiconductor chip in which the gate resistor is disposed.

Also, a sixth aspect of the semiconductor device according to the invention is such that the gate resistor has a vertical diffusion structure forming a vertical direction current path.

Also, a seventh aspect of the semiconductor device according to the invention is such that the semiconductor chip is configured of an insulated gate bipolar transistor.

According to the invention, it is possible, by setting the disposition distance of a gate resistor with respect to a semiconductor chip having a gate terminal in accordance with the temperature condition of the semiconductor chip, to average the temperatures of the semiconductor chips with a simple configuration, using gate resistors with equal resistance values.

BRIEF DESCRIPTION OF THE DRAWINGS

FIG. 1 is an external perspective view of a semiconductor device according to a first embodiment of the invention;

FIGS. 5A to 5C are waveform diagrams illustrating an operation when a half-bridge circuit is turned on;

FIG. 6 is a characteristic diagram showing the relationship between gate resistance and switching loss when the half-bridge circuit is turned on;

FIGS. 8A and 8B are schematic configuration diagrams showing, respectively, a circuit configuration of a semiconductor device according to a third embodiment of the invention, and a corresponding characteristic diagram showing temperature distribution.

DETAILED DESCRIPTION OF THE INVENTION

Figure 2A:
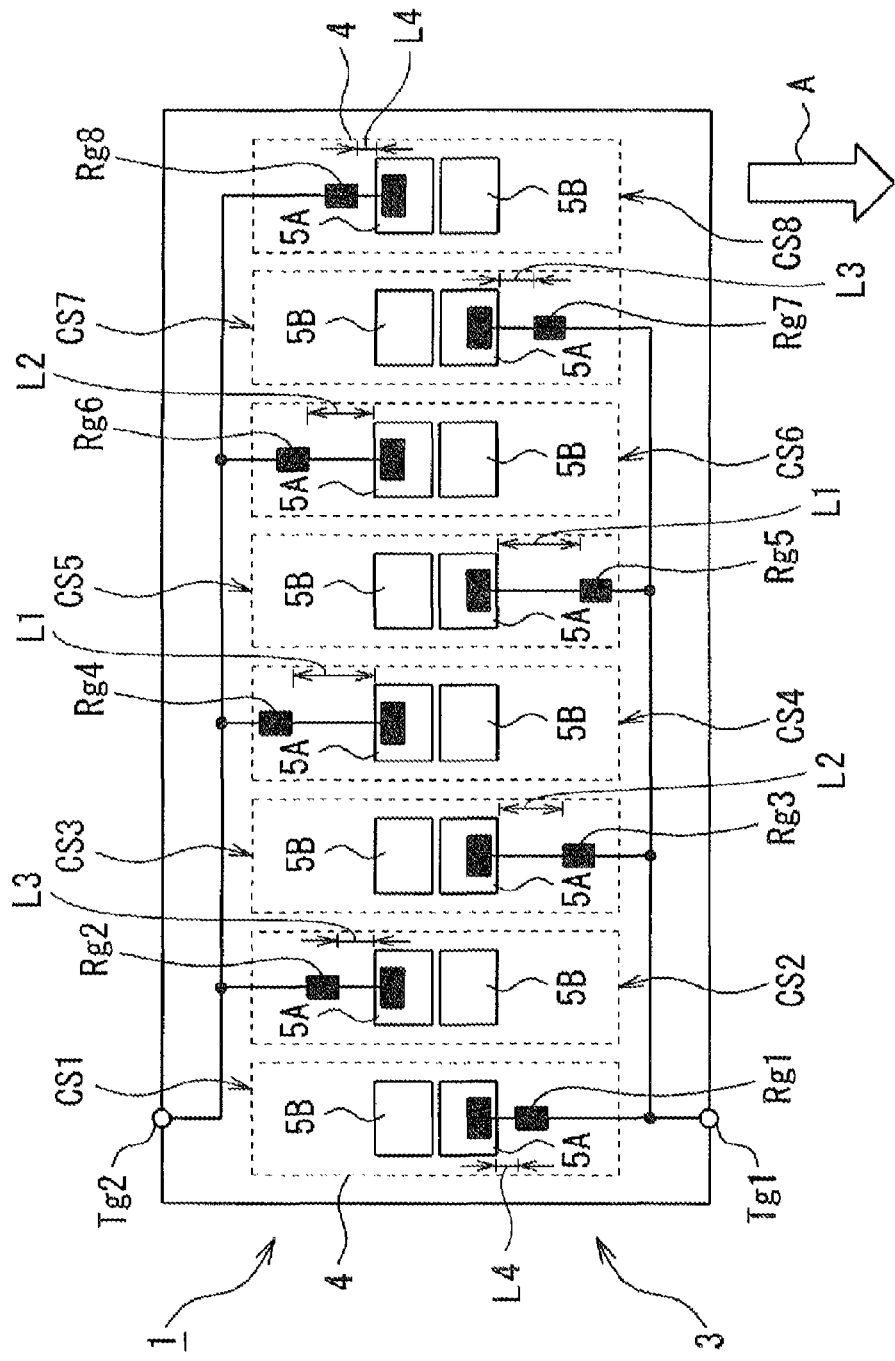
FIGS. 2A and 2B are schematic configuration diagrams showing, respectively, a circuit configuration of the semiconductor device of FIG. 1 and a corresponding characteristic diagram showing temperature distribution.

Hereafter, referring to the drawings, a description will be given of embodiments of the invention.

Figure 2B:
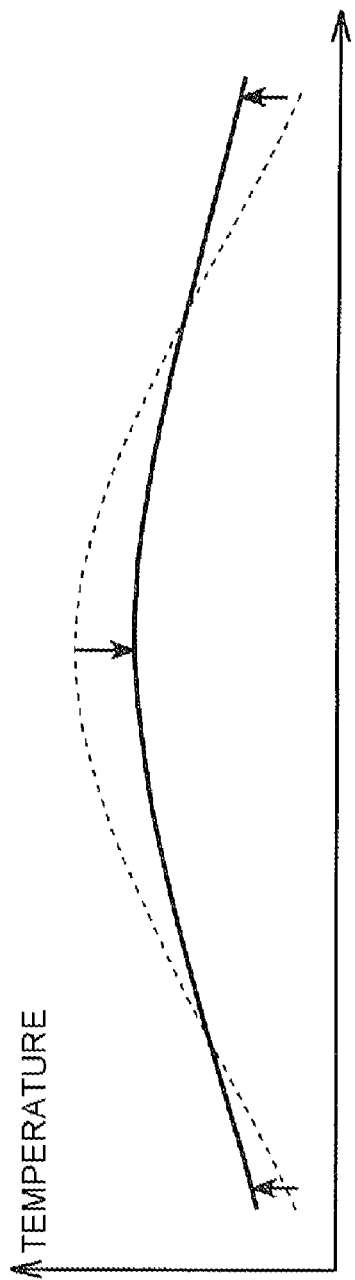

FIG. 1 is an external perspective view of a semiconductor device showing a first embodiment of the invention, while FIGS. 2A and 2B are schematic configuration diagrams, respectively, of a circuit configuration showing the first embodiment, and a characteristic diagram showing temperature distribution.

A semiconductor device 1 includes a power semiconductor module 3 configured by, for example, eight semiconductor circuits CS1 to CS8 being disposed in parallel extending in the longitudinal direction (the left-right direction in FIG. 1) of the case body in a case body 2 having a convex shape when seen from the side, and the semiconductor circuits CS1 to CS8 being molded in. Each of the semiconductor circuits CS1 to CS8 is such that semiconductor chips 5A and 5B are mounted on an insulating substrate 4, as is particularly clear in FIG. 2A.

The semiconductor chip 5A is configured of a voltage controlling semiconductor element having the gate terminal of an insulated gate bipolar transistor (IGBT), a power metal-oxide-semiconductor field-effect transistor (MOSFET), or the like. Also, the semiconductor chip 5B is configured of, for example, a free wheeling diode (FWD).

Herein, the odd-numbered semiconductor circuits CS1, CS3, CS5, and CS7 are such that the semiconductor chip 5A is mounted on the front end side thereof, while the semiconductor chip 5B is mounted on the rear end side. Conversely, the even-numbered semiconductor circuits CS2, CS4, CS6, and CS8 are such that the semiconductor chip 5B is mounted on the front end side thereof, while the semiconductor chip 5A is mounted on the rear end side.

Further, a gate terminal G of the semiconductor chip 5A of each of the odd-numbered semiconductor circuits CS1, CS3, CS5, and CS7 is individually connected via gate resistors Rg1, Rg3, Rg5, and Rg7 to a common gate signal input terminal Tg1 into which is input a gate signal from an unshown gate signal formation circuit.

Also, the gate terminal G of the semiconductor chip 5A of each of the even-numbered semiconductor circuits CS2, CS4, CS6, and CS8 is individually connected via gate resistors Rg2, Rg4, Rg6, and Rg8, configured of vertical diffusers, to a common gate signal input terminal Tg2 into which is input a gate signal from an unshown gate signal formation circuit.

Figure 3:
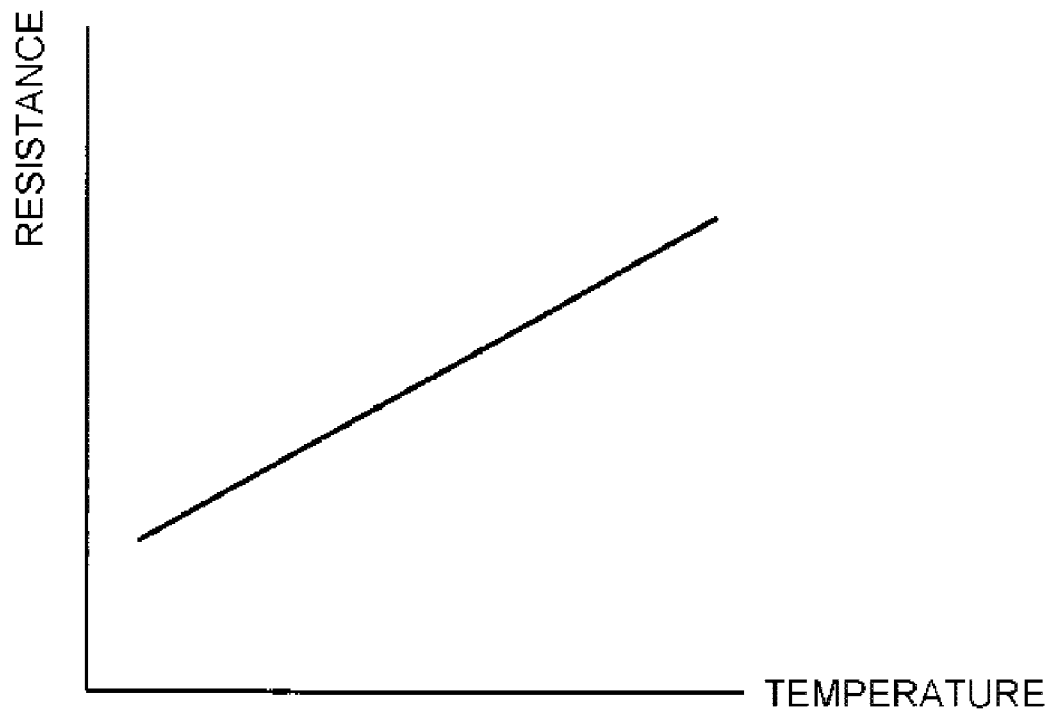
FIG. 3 is a characteristic diagram showing temperature characteristics of a gate resistor.

Herein, each of the gate resistors Rg1 to Rg8 is configured of a resistor having positive temperature characteristics wherein the resistance value rises in response to a rise in temperature, as shown in FIG. 3.

Further, the semiconductor device 1 is such that cooling air acting as a refrigerant flowing from, for example, a cooling fan (not shown), is supplied in a direction perpendicular to the longitudinal direction of the power semiconductor module 3, that is, from the rear side to the front side, as shown by an arrow A in FIGS. 1 and 2A. Because of this, cooling fins 10 extending in a front-back direction are formed on the lower surface side of the semiconductor device 1 so as to form channels allowing the cooling air to pass through, as shown in FIG. 1.

When supplying cooling air to the power semiconductor module 3 in a front-back direction perpendicular to the longitudinal direction of the power semiconductor module 3 in this way, the temperature distribution in the longitudinal direction of the power semiconductor module 3 is as shown by the broken line in FIG. 2B when the resistance values of the gate resistors Rg1 to Rg8 are arranged to be equal and the disposition distances from the semiconductor chip 5A are arranged to be equal. That is, the temperature distribution is such that the temperature in a central portion in the longitudinal direction of the power semiconductor module 3 is high, while the temperature decreases parabolically going from the central portion toward either end portion. Because of this, it is necessary to set the value of current flowing through the semiconductor chip 5A of each semiconductor circuit CS1 to CS8 to a current value so as to avoid an overheat condition, with the high temperature semiconductor circuits CS4 and CS5 disposed in the central portion as a reference, and suppressing the value of current supplied to each semiconductor chip 5A is unavoidable.

Because of this, the invention is such that, focusing on the point that the gate resistors Rg1 to Rg8 have the positive temperature characteristics shown in FIG. 3 wherein the resistance value rises in response to a temperature rise, the resistance values of the gate resistors Rg1 to Rg8 are arranged to be equal, but the disposition distances of the gate resistors Rg1 to Rg8 with respect to the semiconductor chip 5A are set to differing values.

That is, the disposition distances with respect to the semiconductor chip 5A of the gate resistors Rg4 and Rg5 in the central portion semiconductor circuits CS4 and CS5, where the temperature is highest (cooling performance is low), are set to be longest. Further, the disposition distance of the gate resistor with respect to the semiconductor chip is set to a shorter distance in accordance with temperature going from the central portion semiconductor circuits CS4 and CS5 toward the outer sides.

That is, the disposition distances with respect to the semiconductor chip 5A of the gate resistors Rg4 and Rg5 in the central portion semiconductor circuits CS4 and CS5 are set to a longest distance L1. Further, the disposition distances with respect to the semiconductor chip 5A of the gate resistors Rg3 and Rg6 in the semiconductor circuits CS3 and CS6 on the outer sides of the semiconductor circuits CS4 and CS5 are set to a second longest distance L2. Furthermore, the disposition distances with respect to the semiconductor chip 5A of the gate resistors Rg2 and Rg7 in the semiconductor circuits CS2 and CS7 on the outer sides of the semiconductor circuits CS3 and CS6 are set to a third longest distance L3. Further still, the disposition distances with respect to the semiconductor chip 5A of the gate resistors Rg1 and Rg8 in the low exothermic temperature semiconductor circuits CS1 and CS8 on the outermost sides are set to a shortest distance L4.

Figure 4:
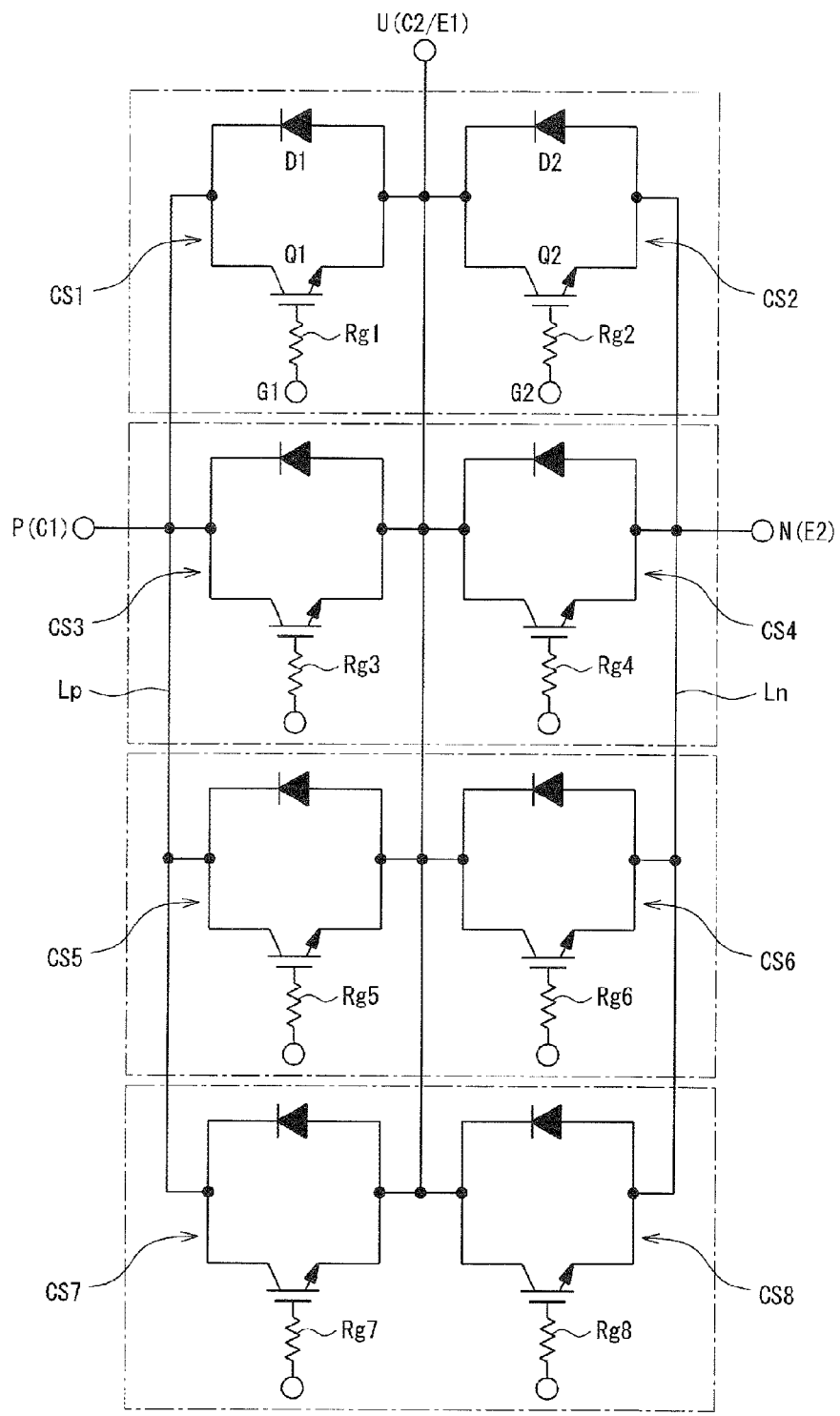
FIG. 4 is a circuit diagram showing an equivalent circuit of a semiconductor device.

Further, an equivalent circuit of the semiconductor circuits CS1 to CS8 disposed in the power semiconductor module 3 is as shown in FIG. 4. That is, a half-bridge circuit having upper and lower arms connected in series is configured of the semiconductor circuits CS1 and CS2. That is, the upper arm is configured of an insulated gate bipolar transistor Q1 configuring the semiconductor chip 5A of the semiconductor circuit CS1 and a free wheeling diode D1 configuring the semiconductor chip 5B connected in anti-parallel to the insulated gate bipolar transistor Q1. Also, the lower arm is configured of an insulated gate bipolar transistor Q2 configuring the semiconductor chip 5A of the semiconductor circuit CS2 and a free wheeling diode D2 configuring the semiconductor chip 5B connected in anti-parallel to the insulated gate bipolar transistor Q2. In the same way, upper and lower arms are formed of each of the semiconductor circuits CS3 and CS4, CS5 and CS6, and CS7 and CS8, connected in series. Further, each upper and lower arm is connected in parallel to a positive electrode side power supply line Lp and a negative electrode side power supply line Ln, thereby configuring a one-phase portion of an inverter configuring a power conversion device.

Next, a description will be given of an operation of the first embodiment.

As previously described, the power semiconductor module 3 is cooled by a cooling air being supplied in a direction perpendicular to the longitudinal direction of the power semiconductor module 3. In this condition, gate signals formed of, for example, pulse width modulation (PWM) signals are supplied at differing predetermined times via the gate signal input terminals Tg1 and Tg2 to the gate terminal of each semiconductor circuit CS1 to CS8. The gate signals are supplied via each gate resistor Rg to the gate terminal of the insulated gate bipolar transistor configuring the semiconductor chip 5A.

Figure 5A:
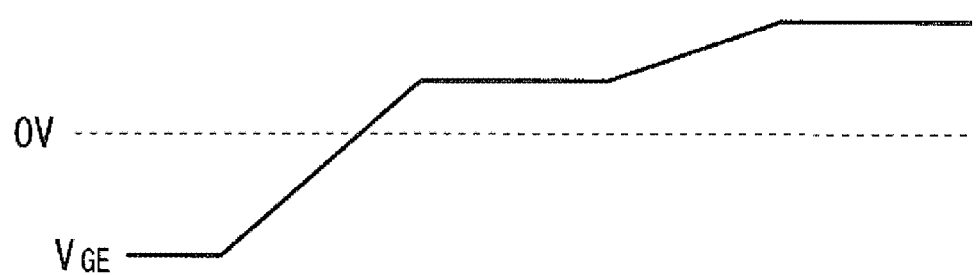
Figure 5B:
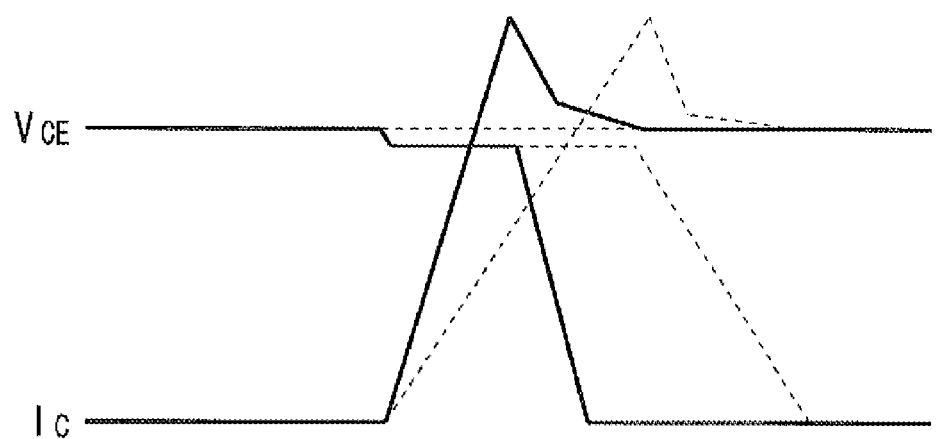
Figure 5C:
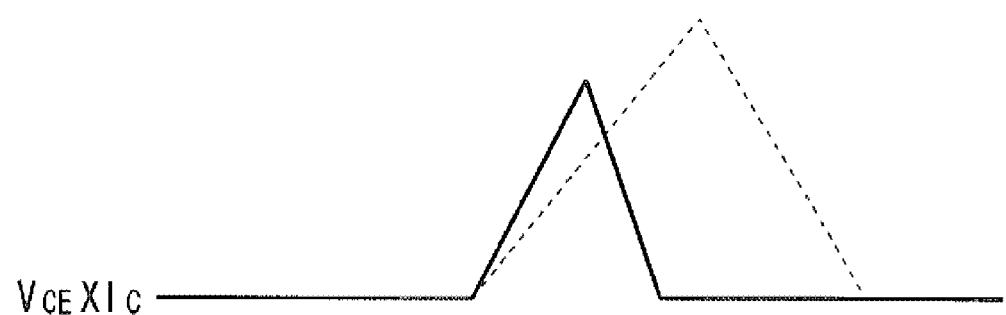

Because of this, the insulated gate bipolar transistor starts a turn-on operation, as shown in FIGS. 5A to 5C. In FIGS. 5A to 5C, the horizontal axis represents time while the vertical axis represents voltage. Herein, when the resistance value of a gate resistor Rgi (i=1 to 8) is low, a gate-emitter voltage $V_{GE}$ of the insulated gate bipolar transistor starts to rise when a gate voltage of a predetermined value is applied to the gate. Further, at a point at which the gate-emitter voltage $V_{GE}$ exceeds 0V and reaches a predetermined threshold voltage, a collector current Ic starts to increase comparatively sharply, as shown by a solid line in FIG. 5B. At this time, a collector-emitter voltage $V_{CE}$ decreases slightly but essentially maintains a predetermined voltage, as shown by a solid line in FIG. 5B, and the gate-emitter voltage $V_{GE}$ maintains the predetermined threshold voltage.

Subsequently, when the collector current Ic starts to decrease after reaching a peak current, as shown by the solid line in FIG. 5B, the collector-emitter voltage $V_{CE}$ starts to decrease in response to the decrease of the collector current Ic, and decreases comparatively sharply. At this time, the Miller capacitance (gate-collector capacitance) of the insulated gate bipolar transistor increases, and the gate-emitter voltage $V_{GE}$ maintains the predetermined threshold voltage.

Further, at a point at which the collector-emitter voltage $V_{CE}$ becomes an on-state voltage in a sufficiently low steady state, the turn-on is completed, the Miller capacitance ceases to change, and the gate-emitter voltage $V_{GE}$ rises again, reaches the gate voltage, and becomes constant.

The value of the collector current Ic and collector-emitter voltage $V_{CE}$ multiplied together during the turn-on period is at a maximum at a point at which the collector current Ic reaches the peak, as shown in FIG. 5C.

In this way, as the turn-on time is short and the switching speed is high when the resistance value of the gate resistor Rgi is low, switching loss decreases.

As opposed to this, when the resistance value of the gate resistor Rgi is high, the increase gradient of the collector current Ic becomes gentler and the decrease of the collector-emitter voltage $V_{CE}$ slows, as shown by dotted lines in FIGS. 5A to 5C, and the turn-on time increases. Because of this, the switching speed decreases, and switching loss increases.

Figure 6:
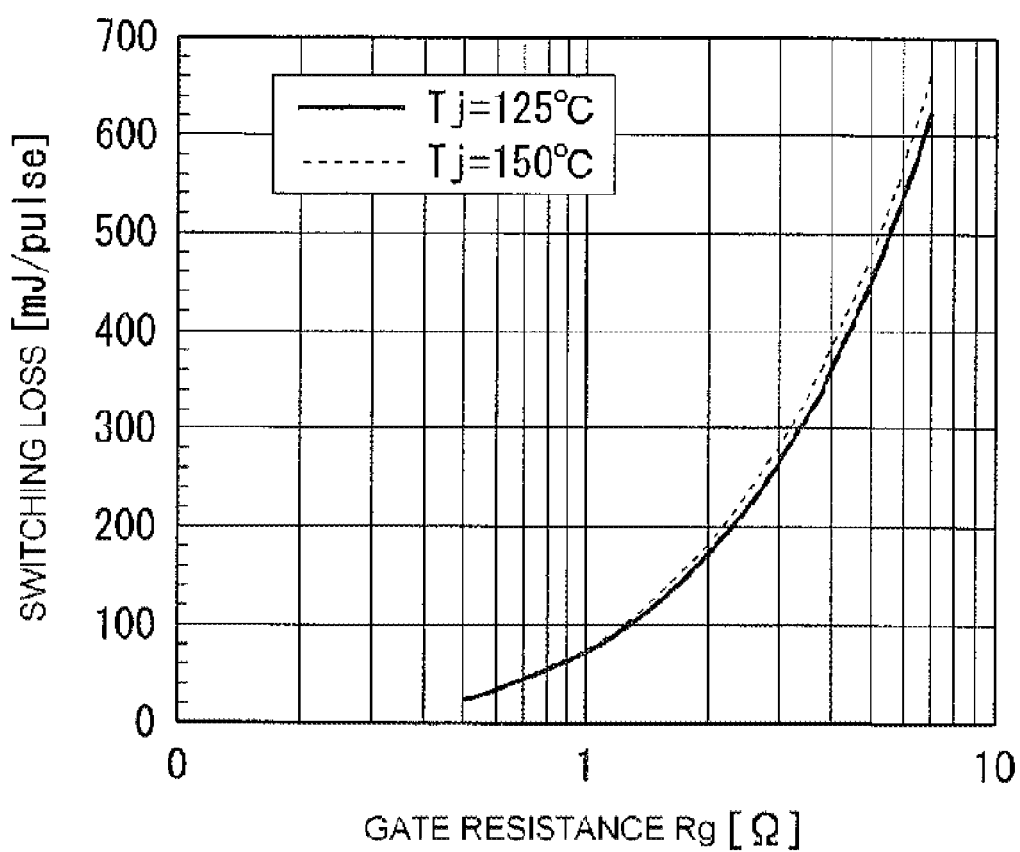

The relationship between the gate resistance Rg and switching loss when turning on is such that when the gate resistance Rg increases, switching loss also increases, as shown by a quadratic characteristic curve Lg in FIG. 6.

Note that, in the first embodiment, the disposition distance between the semiconductor chip 5A and gate resistors Rg4 and Rg5 is set to be long in the central portion in the longitudinal direction of the power semiconductor module 3, where the cooling effect of the cooling air is low and the exothermic temperature is high, while the disposition distance between the semiconductor chip 5A and gate resistor Rg is set to become shorter going from the central portion to the outer sides.

Because of this, even though the resistance values of the gate resistors Rg1 to Rg8 of the semiconductor circuits CS1 to CS8 are set to be equal, the disposition distances between the gate resistors Rg1 to Rg8 and semiconductor chip 5A differ. Because of this, the central portion of the power semiconductor module 3 is such that, by the disposition distance of the gate resistors Rg4 and Rg5 being long, the temperature of heat reaching the gate resistors Rg4 and Rg5 is low with respect to the exothermic temperature of the semiconductor chip 5A compared with when the disposition distance is short, and the resistance value decreases. Consequently, the switching speed of the semiconductor circuits CS4 and CS5 in the central portion of the power semiconductor module 3 is increased, and switching loss is suppressed. As a result of this, heat generation by the semiconductor chips 5A of the semiconductor circuits CS4 and CS5 is suppressed.

Also, as the disposition distance between the gate resistor Rg and semiconductor chip 5A becomes shorter going from the central portion to the outer sides, the heat generated by the semiconductor chip 5A is more easily transmitted. Because of this, the resistance value of the gate resistor increases, the switching speed is reduced in accordance with the increase of the resistance value, and switching loss increases. As a result of this, heat generation by the semiconductor chips 5A of the semiconductor circuits CS1 and CS8 on the outermost sides is promoted.

Because of this, the temperature distribution in the longitudinal direction of the power semiconductor module 3 is such that, as shown by the solid line in FIG. 2B, the temperature of the central portion side is reduced with respect to the temperature distribution shown by the dotted line when the disposition distances of the gate resistors are equal, while conversely, the temperature of either end side rises. As a result of this, the temperature difference in the longitudinal direction of the power semiconductor module 3 decreases, and the maximum temperature decreases, because of which it is possible to increase the allowable current carrying capacity of the insulated gate bipolar transistor configuring the semiconductor chip 5A of each semiconductor circuit CS1 to CS8 of the power semiconductor module 3.

In the first embodiment, a description has been given of a case wherein the cooling air supply direction is such that the cooling air is supplied from the rear side to the front side perpendicular to the longitudinal direction of the power semiconductor module 3, but the same operational advantage effect can also be obtained when the cooling air is supplied from the front side to the rear side.

Next, a description will be given, based on FIGS. 7A and 7B, of a second embodiment of the invention.

In the second embodiment, the cooling air supply direction is such that the cooling air is supplied in the longitudinal direction of the power semiconductor module 3. In accordance with this, the extension direction of the cooling fins mounted on the lower surface of the power semiconductor module 3 is caused to coincide with the longitudinal direction of the power semiconductor module 3.

Figure 7A:
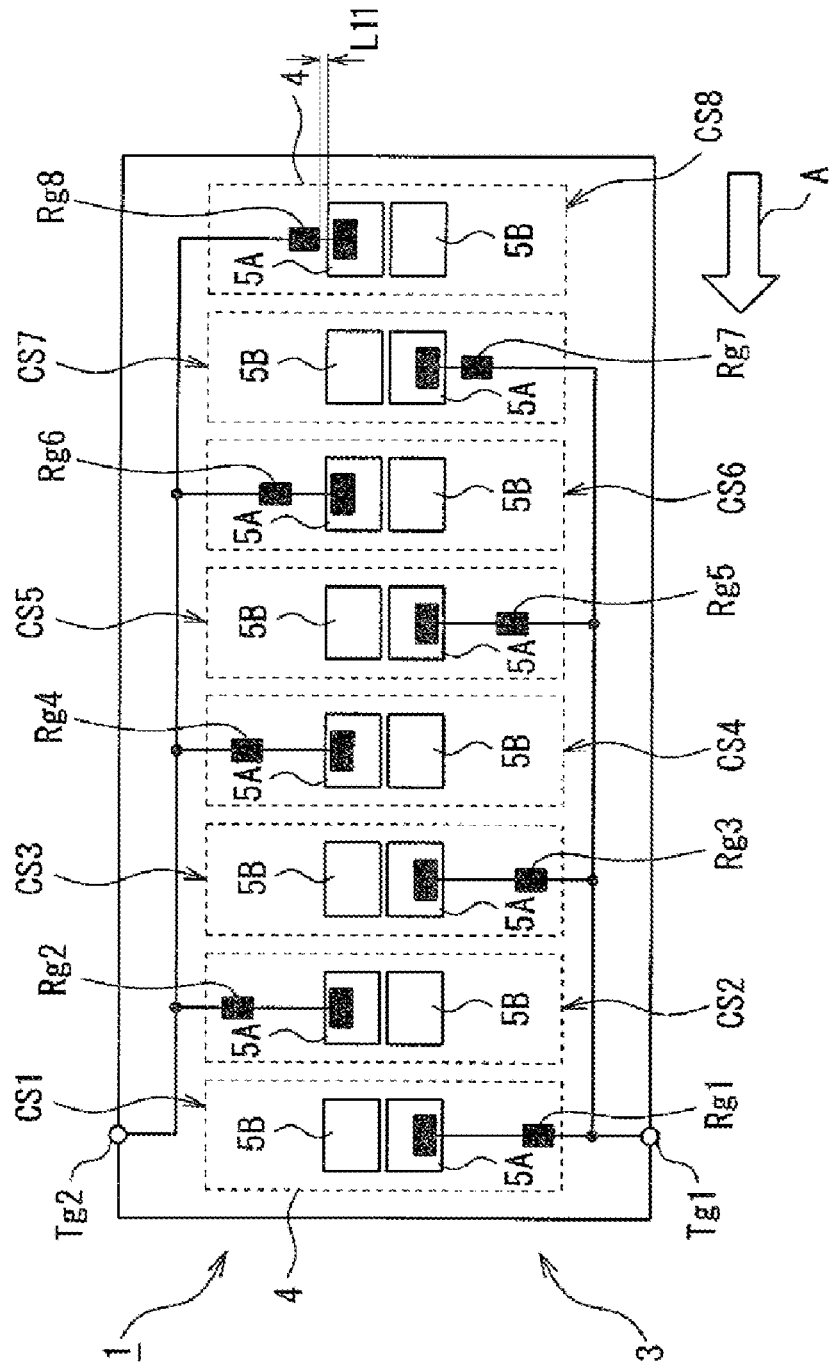
FIGS. 7A and 7B are schematic configuration diagrams showing, respectively, a circuit configuration of a semiconductor device according to a second embodiment of the invention, and a corresponding characteristic diagram showing temperature distribution.
Figure 7B:
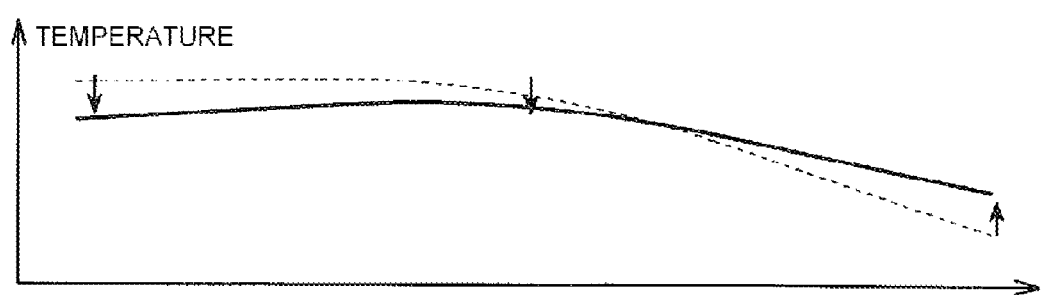

That is, in the second embodiment, a cooling air is supplied from, for example, the right side to the left side in the longitudinal direction of the power semiconductor module 3, which has the same configuration as in the first embodiment, as shown in FIG. 7A. In this case, when the resistance values of the gate resistors Rg1 to Rg8 of the semiconductor circuits CS1 to CS8 are set to be equal and the disposition distances between the gate resistors Rg1 to Rg8 and semiconductor chip 5A are equal, the temperature distribution is such that the temperature on the upstream side, that is, the right side, of the cooling air supply is low, and the temperature rises going toward the downstream side.

Because of this, the second embodiment is such that, in a condition wherein the resistance values at the same temperature of the semiconductor circuits CS1 to CS8 are set to be equal, an disposition distance L11 with respect to the semiconductor chip 5A of the gate resistor Rg8 in the right end side semiconductor circuit CS8 is set to a minimum, and the disposition distance with respect to the semiconductor chip 5A is set to become longer going from the right end side toward the left hand side, that is, in the order of the gate resistors Rg7, Rg6, Rg5, and so on in the semiconductor circuits CS7, CS6, CS5, and so on.

According to the second embodiment, as the disposition distance with respect to the semiconductor chip 5A of the gate resistor Rg8 in the upstream side semiconductor circuit CS8, wherein the cooling efficiency is good and the exothermic temperature is low, is set to be short, the heat generated by the semiconductor chip 5A is easily transmitted to the gate resistor Rg8, and the resistance value increases. Because of this, in the same way as in the first embodiment, it is possible to reduce the switching speed and increase switching loss, thereby increasing the amount of heat generated by the insulated gate bipolar transistor configuring the semiconductor chip 5A, as shown by the solid line in FIG. 7B, with respect to the temperature indicated by the dotted line when the disposition distance between the semiconductor chip 5A and gate resistor is constant.

Meanwhile, the semiconductor circuits CS7, CS6, CS5, and so on, to the left of the semiconductor circuit CS8 are such that the disposition distances between the gate resistors Rg7, Rg6, Rg5, and so on to Rg1, and the semiconductor chip 5A become sequentially longer. Because of this, the switching speed decreases and switching loss is reduced going toward the left side semiconductor circuits, and the amount of heat generated by the semiconductor chip 5A is suppressed. Because of this, it is possible to reduce the temperature of the semiconductor circuits to the left of the semiconductor circuit CS5 toward the central portion of the power semiconductor module 3, as shown by the solid line in FIG. 7B, with respect to the temperature indicated by the dotted line when the disposition distance between the semiconductor chip 5A and gate resistor is constant.

As a result of this, it is possible to average the temperature distribution in the longitudinal direction of the power semiconductor module 3 when the cooling air is supplied along the power semiconductor module 3, and it is possible to reduce the maximum temperature of the semiconductor circuits in comparison with when the distance between the semiconductor chip and gate resistor is constant. It is possible to increase the allowable current carrying capacity of the insulated gate bipolar transistor configuring the semiconductor chip 5A.

In the second embodiment, a description has been given of a case wherein a cooling air is supplied from the right side to the left side in the longitudinal direction of the power semiconductor module 3, but the invention is not limited to this. That is, when supplying a cooling air from the left side to the right side in the longitudinal direction of the power semiconductor module 3, it is sufficient to set the disposition distance between the gate resistor Rg1 and semiconductor chip 5A of the semiconductor circuit CS1 on the left side, which is the upstream side, to the minimum distance, and to set the disposition distances between the gate resistors and semiconductor chip 5A to become sequentially longer going from the semiconductor circuit CS1 to the right side in accordance with the temperature shown by the dotted line in FIG. 7B.

Next, a description will be given, based on FIGS. 8A and 8B, of a third embodiment of the invention.

In the third embodiment, as opposed to the first embodiment, the disposition distances between the gate resistors Rg4 and Rg5 and semiconductor chip 5A of the semiconductor circuits CS4 and CS5 in the central portion of the power semiconductor module 3 are set to the minimum distance, and the disposition distances between the gate resistors and semiconductor chip 5A are set to become sequentially longer going from the semiconductor circuits CS4 and CS5 to the outer sides, as shown in FIG. 8A.

At the same time, the gate terminals of the insulated gate bipolar transistors configuring the semiconductor chips 5A of the semiconductor circuits CS4 and CS5 in the central portion are connected to the gate signal input terminals Tg1 and Tg2 via the gate resistors Rg1 and Rg8 formed in the semiconductor circuits CS1 and CS8 at either end side.

Also, the gate terminals of the insulated gate bipolar transistors configuring the semiconductor chips 5A of the semiconductor circuits CS3 and CS6 are connected to the gate signal input terminals Tg1 and Tg2 via the gate resistors Rg2 and Rg7 formed in the semiconductor circuits CS2 and CS7 inward from either end.

Furthermore, the gate terminals of the insulated gate bipolar transistors configuring the semiconductor chips 5A of the semiconductor circuits CS2 and CS7 are connected to the gate signal input terminals Tg1 and Tg2 via the gate resistors Rg3 and Rg6 formed in the semiconductor circuits CS3 and CS6 inward from either end.

Further still, the gate terminals of the insulated gate bipolar transistors configuring the semiconductor chips 5A of the semiconductor circuits CS1 and CS8 at either end side are connected to the gate signal input terminals Tg1 and Tg2 via the gate resistors Rg4 and Rg5 formed in the semiconductor circuits CS4 and CS5 in the central portion.

According to the third embodiment, the semiconductor circuits CS4 and CS5 in the central portion, wherein cooling performance is low and the temperature is high, are connected to the gate signal input terminals Tg1 and Tg2 via the gate resistors Rg1 and Rg8, whose disposition distances from the semiconductor chip 5A are longest and which act as the gate resistors of the semiconductor circuits CS4 and CS5, formed in the semiconductor circuits CS1 and CS8 in either side portion, wherein cooling capacity is high and the temperature is low. Because of this, it is possible for the gate resistance value of the insulated gate bipolar transistors configuring the semiconductor chips 5A of the central portion semiconductor circuits CS4 and CS5 to be set lower than in the first embodiment, and thus possible to further reduce switching loss, and sufficiently suppress the exothermic temperature.

Moreover, as the gate resistance value increases further going from the central portion to either end side than in the case of the first embodiment, it is possible to set the gate resistance value progressively higher going toward either end side than in the first embodiment, and thus possible to further increase switching loss, and increase the exothermic temperature.

Figure 8B:
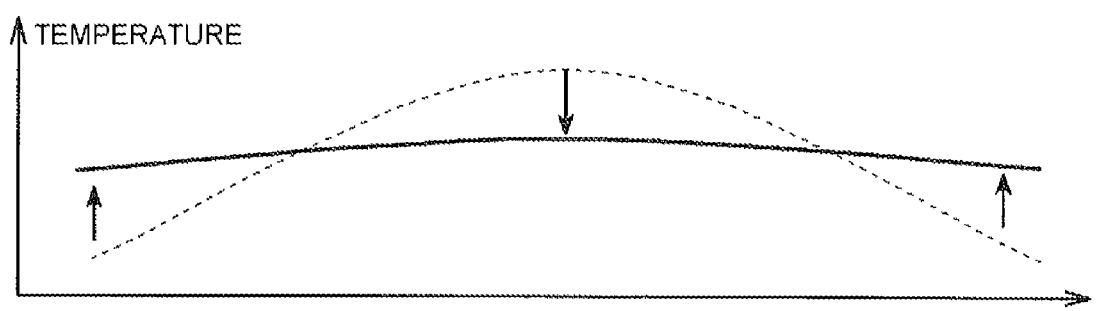

As a result of this, it is possible to further average the longitudinal direction temperature distribution of the power semiconductor module 3 compared with the first embodiment, as shown in FIG. 8B, possible to further reduce the maximum temperature, and thus possible to further increase the allowable current amount of the semiconductor chip 5A of each semiconductor circuit CS1 to CS8.

Figure 9:
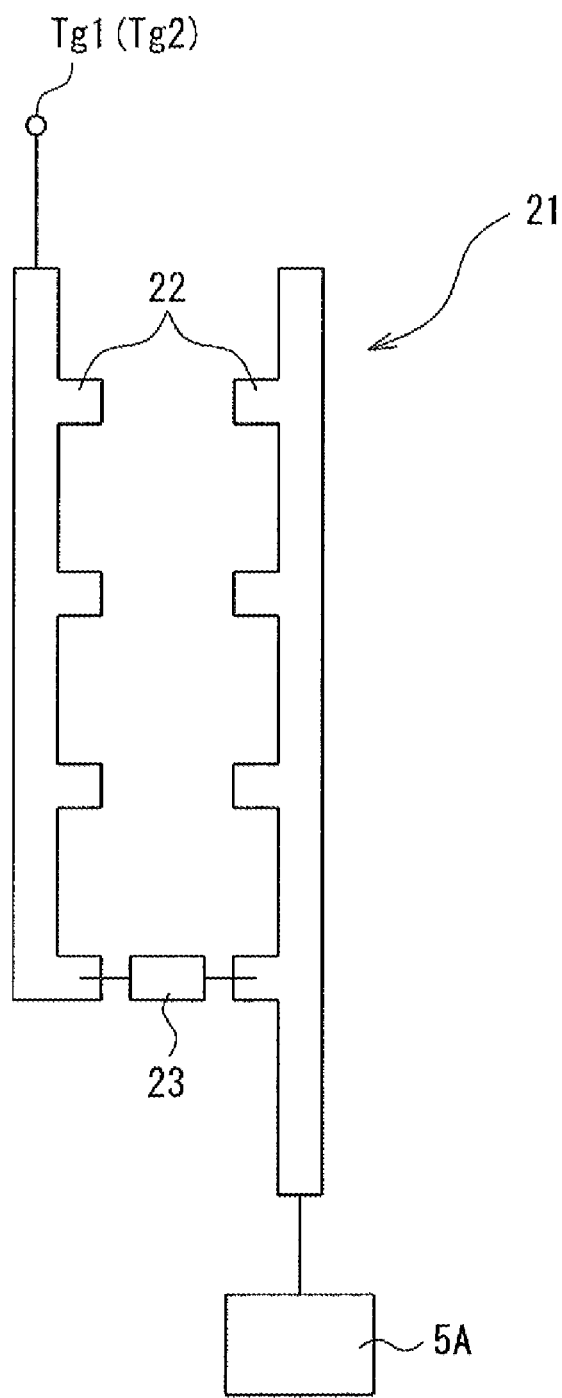
FIG. 9 is a plan view showing a wiring pattern wherein discrete resistors are disposed.

In the first to third embodiments, a description has been given of a case wherein the gate resistors Rg1 to Rg8 are vertical diffusers but, the invention not being limited to this, discrete resistors may also be used. In this case, in order to set the disposition distances of the discrete resistors, it is preferable that a pair of wiring patterns 21 are formed in each semiconductor circuit CS1 to CS8 extending in a front-back direction perpendicular to the longitudinal direction of the power semiconductor module 3, and that a plurality of mutually opposing connection pads 22 are formed maintaining predetermined intervals in the front-back direction on the wiring patterns 21, as shown in FIG. 9. In this case, it is sufficient to select connection pads 22 in accordance with a disposition distance from the semiconductor chip 5A in accordance with the temperature distribution of the semiconductor circuits CS1 to CS8, and connect a discrete resistor 23 to the connection pads 22.

Also, in the first to third embodiments, a description has been given of a case wherein the semiconductor chip 5A is configured of an insulated gate bipolar transistor but, the invention not being limited to this, it is possible to apply another voltage controlling semiconductor element having the gate terminal of a power field-effect transistor, or the like.

Furthermore, in the first to third embodiments, a description has been given of a case wherein one set of the semiconductor chips 5A and 5B is mounted on the semiconductor circuits CS1 to CS8 but, the invention not being limited to this, two or more sets of the semiconductor chips 5A and 5B may be mounted.

Also, in the first to third embodiments, a description has been given of a case wherein the eight semiconductor circuits CS1 to CS8 are disposed in parallel in the power semiconductor module 3 but, the invention not being limited to this, it is possible to dispose an arbitrary number of semiconductor circuits in parallel.

Also, in the first to third embodiments, a description has been given of a case wherein cooling air is applied as a cooling medium but, the invention not being limited to this, it is possible to apply another cooling medium, such as cooling water.

Also, the invention not being limited to the heretofore described power converting inverter device, the invention can be applied to another semiconductor device, such as another power conversion device or a high frequency application switching IC, using a power semiconductor module.

What is claimed is:

1. A semiconductor device, comprising
a semiconductor module wherein a plurality of circuit substrates, on which are respectively mounted one or more semiconductor chips each having a gate terminal and a gate resistor connected to the gate terminal, are disposed in parallel, wherein
a disposition distance of the gate resistor from the semiconductor chip is set based on a temperature of the semiconductor chip.

2. The semiconductor device according to claim 1, wherein a disposition distance between the gate resistor and a semiconductor chip of the one or more semiconductor chips is set to be long when the temperature of the semiconductor chip is high and set to be short when the temperature of the semiconductor chip is low.

3. The semiconductor device according to claim 1, wherein a disposition distance between the gate resistor and a semiconductor chip of the one or more semiconductor chips in a central portion circuit substrate is set to be long with respect to a disposition distance in circuit substrates in either of end portions of the semiconductor module when a refrigerant flow is supplied in a direction intersecting with a disposition direction of the circuit substrates.

4. The semiconductor device according to claim 1, wherein a disposition distance between the gate resistor and a semiconductor chip of the one or more semiconductor chips in a downstream side circuit substrate is set to be long with respect to a disposition distance between the gate resistor and a semiconductor chip of the one or more semiconductor chips in an upstream side circuit substrate when a refrigerant flow is supplied in a disposition direction of the circuit substrates.

5. The semiconductor device according to claim 1, wherein the circuit substrates are such that parallel wiring patterns, having a plurality of connection pads to which a discrete resistor is connected, are formed in a region in a vicinity of a semiconductor chip of the one or more semiconductor chips, so as to enable a selection of disposition distances.

6. The semiconductor device according to claim 1, wherein the gate resistor has a vertical diffusion structure forming a vertical direction current path.

7. The semiconductor device according to claim 1, wherein the semiconductor chip is an insulated gate bipolar transistor.

8. The semiconductor device according to claim 2, wherein the circuit substrates are such that parallel wiring patterns, having a plurality of connection pads to which a discrete resistor is connected, are formed in a region in a vicinity of a semiconductor chip of the one or more semiconductor chips, so as to enable a selection of disposition distances.

9. The semiconductor device according to claim 3, wherein the circuit substrates are such that parallel wiring patterns, having a plurality of connection pads to which a discrete resistor is connected, are formed in a region in a vicinity of a semiconductor chip of the one or more semiconductor chips, so as to enable a selection of disposition distances.

10. The semiconductor device according to claim 4, wherein
the circuit substrates are such that parallel wiring patterns, having a plurality of connection pads to which a discrete resistor is connected, are formed in a region in a vicinity of a semiconductor chip of the one or more semiconductor chips, so as to enable a selection of disposition distances.

11. An apparatus, comprising:
a plurality of semiconductor devices arranged on a module, each of the plurality of semiconductor devices being connected by a connector to a resistor, and each connector having a length different from at least one other connector;
wherein a distribution of the plurality of semiconductor devices with respect to an area of the module is based on a temperature distribution in the module that results from operation of the plurality of semiconductor devices.

12. The apparatus of claim 11, wherein relative lengths of the connectors increase in a direction from one end of the module toward a center of the module, then decrease in a direction away from the center of the module toward another end of the module.

13. The apparatus of claim 11, wherein relative lengths of the connectors increase in a direction from one end of the module toward another end of the module.

14. The apparatus of claim 11, wherein a resistor closer to a center of the module than another resistor is connected to a semiconductor device of the plurality of semiconductor devices that is farther from the center of the module than another of the semiconductor devices connected to the other resistor.

15. The apparatus of claim 11, wherein the distribution of the plurality of semiconductor devices tends to equalize the temperature distribution across the area of the module.

16. The apparatus of claim 11, wherein the distribution of the plurality of semiconductor devices lowers a peak of the temperature distribution as compared to a temperature distribution of a comparable module wherein connector lengths do not vary.

* * * * *